United States Patent
Bernier

[19]

[11] Patent Number: 5,861,639
[45] Date of Patent: Jan. 19, 1999

[54] BREAKOVER-TRIGGERED DIPOLE COMPONENT HAVING A CONTROLLED SENSITIVITY

[75] Inventor: Eric Bernier, Tours, France

[73] Assignee: SGS-Thomson Microelectronics S.A., Saint Genis, France

[21] Appl. No.: 880,856

[22] Filed: Jun. 23, 1997

Related U.S. Application Data

[63] Continuation of Ser. No. 561,523, Nov. 21, 1995, abandoned.

[30] Foreign Application Priority Data

Nov. 25, 1994 [FR] France .................................... 94 14415

[51] Int. Cl.⁶ .................................................. H01L 29/74
[52] U.S. Cl. .......................... 257/157; 257/112; 257/161; 438/133; 327/461
[58] Field of Search .......................... 257/109–112, 146, 257/157, 161; 327/461, 462, 463; 438/133, 134, 135

[56] References Cited

U.S. PATENT DOCUMENTS

| | | | |
|---|---|---|---|
| 4,195,306 | 3/1980 | Füllmann et al. | 257/161 |
| 4,217,504 | 8/1980 | Füllmann et al. | 257/161 |
| 4,446,478 | 5/1984 | Bacuvier | 257/161 |
| 4,529,998 | 7/1985 | Lade et al. | 357/38 |

FOREIGN PATENT DOCUMENTS

| | | | |
|---|---|---|---|
| 52-10085 | 1/1977 | Japan | 257/157 |
| A-2 069 255 | 8/1981 | United Kingdom | H03K 17/72 |

OTHER PUBLICATIONS

Patent Abstracts of Japan, vol. 5, No. 149 (E–75)(821) Sep. 19, 1981 & JP–A–56 081970 Mitsubishi Denki K.K.
Patent Abstracts of Japan, vol. 5, No. 117 (E–67) Jul. 28, 1981 & JP–A–56 055068 Hitachi Ltd.
IEEE Transactions On Electron Devices, vol. 31, No. 11, Nov. 1984, pp. 1570–1591, Michael S. et al., "The Evolution of Power Device Technology".
Patent Abstracts of Japan, vol. 5, No. 95 (E–62)(767) Jun. 20, 1981 & JP–A–56 040277 Fuji Denki Seizo K.K.
Patent Abstracts of Japan, vol. 9, No. 85 (E–308)(1808) Apr. 13, 1985 & JP–A–59 217366 Toshiba K.K.

*Primary Examiner*—Olik Chaudhuri
*Assistant Examiner*—Nathan K. Kelley
*Attorney, Agent, or Firm*—Wolf, Greenfield & Sacks, P.C.

[57] ABSTRACT

A dipole component with a controlled breakover sensitivity includes a main thyristor having its gate connected to its anode through a pilot thyristor, and a triggering transistor disposed in parallel with the pilot thyristor, the base of the triggering transistor being connected to the gate of the pilot thyristor.

26 Claims, 3 Drawing Sheets

BREAKOVER-TRIGGERED DIPOLE COMPONENT HAVING A CONTROLLED SENSITIVITY

This application is a continuation of application Ser. No. 08/561,523, filed Nov. 21, 1995, now abandoned.

BACKGROUND OF THE INVENTION

1. Field of the Invention

The present invention relates to a dipole component triggered by a breakover voltage, i.e. a component having the function of a Shockley diode that is turned on when the voltage becomes higher than a predetermined voltage. The present invention more particularly relates to such a component in which the breakover voltage and breakover current can be accurately determined upon fabrication. The invention provides such a component in which the breakover current is low while having reduced sensitivity to spurious triggering associated with voltage edges (dV/dt triggering).

2. Discussion of the Related Art

Such a component is, for example, useful in a gas-lighter circuit such as the circuit illustrated in FIG. 1. This circuit includes, between supply terminals A and B, corresponding for example to the 220-V, 50-Hz a.c. voltage of the mains, a resistor Rs, a rectifying diode Dr, a switch S, a capacitor C and the primary of a high frequency transformer T. The secondary of the transformer comprises windings L1 and L2 connected to lighters 1 and 2, respectively, for example associated with two fires of a gas cooker. A circuit comprising a parallel thyristor Th, which is head-to-tail connected to a diode D, is connected between the input terminal of capacitor C and terminal B. An avalanche diode Z is disposed between the gate and the anode of thyristor Th.

The operation of the circuit will be described with relation to FIG. 2. In FIG. 2, the curve 10 represents the voltage between terminals A and B which is an a.c. voltage having a peak value Vp. Once switch S is turned on, at the beginning of a positive half-period, capacitor C begins to be loaded until the avalanche voltage VZ of the avalanche diode Z is reached. Then, a current tends to flow in the gate-cathode junction of thyristor Th. When this current reaches value $I_{BO}$, the thyristor Th becomes conductive in a low impedance state and capacitor C discharges in thyristor Th, then through diode D, thereby producing a discharge current oscillating at a high frequency from capacitor C to thyristor Th and in the parallel, head-to-tail connected diode D. This current oscillation is converted by the transformer to windings L1 and L2, which causes sparks to occur in the lighters 1 and 2.

This circuit requires strict conditions for the triggering of thyristor Th. Indeed, once the avalanche voltage VZ of diode Z is reached, a sufficient current $I_{BO}$ to trigger the thyristor Th should be able to flow. This current $I_{BO}$ is provided by the rectified supply voltage. The maximum value of this current is determined by equation:

$$RsI_{BO(MAX)} = Vp - VZ,$$

where Vp designates the peak value of the voltage between terminals A and B. In practice, voltage VZ is imposed to obtain a sufficient discharge voltage and the maximum tolerable value of resistor Rs must be relatively high to allow the selection of a long time duration between two sparks.

Assuming that Rs=10 kΩ, the peak voltage Vp between terminals A and B is 300 volts, and further assuming that VZ=250 volts, one obtains:

$$I_{BO(MAX)} = (300-250)/10000 = 5 \text{ mA}.$$

In practice, this is a very low triggering current for a thyristor. Usually, a conventional thyristor withstanding 400 volts has a triggering current $I_{BO}$ of a few tens of a mA. A further difficulty is that voltage VZ of the avalanche diode Z should be accurately determined so that value $I_{BO(MAX)}$ does not vary too much and so that the triggering range is not further reduced.

FIG. 3 represents the voltage-current curve of a thyristor. When voltage $V_{BO}$ (i.e., voltage VZ of the avalanche diode) is reached, the current in the thyristor starts to increase, then the voltage across the thyristor abruptly drops whereas the thyristor is turned on as soon as the current in the thyristor has reached $I_{BO}$. The invention aims at providing a dipole component of the thyristor-type having both a low value $I_{BO}$ and an accurately determined value $V_{BO}$ (VZ).

FIG. 4 represents a conventional circuit of a breakover triggered dipole component including an amplifying-gate thyristor circuit providing this function. The thyristor Th is associated with a pilot thyristor Th1. The anodes of thyristors Th and Th1 are interconnected, the cathode of thyristor Th1 is connected to the gate of thyristor Th1 through a resistor R. The triggering diode Z is disposed between the anode and the gate of thyristor Th1. The gate-cathode resistor of thyristor Th is labeled R'.

Techniques are known to fabricate a very sensitive thyristor Th1 but this requires the use, between the cathode and the gate, of a resistor R having a non-negligible value (ranging approximately from 1 to 10 kΩ) to prevent the thyristor Th1 from being triggered by spurious overvoltages on the supply, i.e., by dV/dt triggering.

FIG. 5 illustrates a conventional monolithic component implementing the circuit of FIG. 4. This component is fabricated from a low doped N-type substrate 21. In the upper surface of the substrate, P-type regions 22, 23 and 24 correspond to the anode of diode D, to the gate of thyristor Th and to the gate of the pilot thyristor Th1, respectively. N-type regions 26 and 27 correspond to the cathodes of thyristors Th and Th1, respectively. The cathode of thyristor Th is provided with emitter-shorts to render this thyristor non-sensitive whereas the cathode of the pilot thyristor Th1 is devoid of emitter-shorts to render the pilot thyristor highly sensitive. The rear surface of the substrate includes, facing the cathodes of thyristors Th and Th1, a P-type region 28 corresponding to the common anode of thyristors Th and Th1. The rear surface further includes, facing the anode region 22 of diode D, an $N^+$-type region 29 corresponding to the cathode contact of diode D. The rear surface is uniformly coated with a metallization 30. The cathode area of thyristor Th and the anode area of diode D are coated with a metallization 31. The cathode region 27 of thyristor Th1 is connected to the gate region 23 of thyristor Th through a metallization 32. Resistor R is formed by a low conductive P-type region 34 that is disposed between the P regions 23 and 24. The junction corresponding to the zener diode Z is formed by providing a highly doped N-type layer 35 at the interface between region 24 and substrate 21.

The implementation illustrated in FIG. 5 has several drawbacks. On the one hand, this circuit requires, in addition to the conventional layers used for the fabrication of a thyristor, the presence of the highly doped N-type "buried" layer 35 and more particularly the presence of the low-doped P-type region 34 which imposes the provision of additional fabrication steps. On the other hand, as indicated above, in order to obtain a sufficient resistance, approximately 1 to 10 kΩ, between the cathode and the gate of thyristor Th1, region 34 should have a very low doping level. This imposes fabrication constraints and makes the device difficult to reproduce from one batch to the other.

SUMMARY OF THE INVENTION

An object of the present invention is to provide a dipole component having both a controlled breakover voltage and breakover current, the breakover current being set to a low value.

Another object of the present invention is to provide such a component that can be fabricated in a simple and reproducible manner.

A further object of the present invention is to provide such a component in which the values of the breakover current and breakover voltage can be independently selected.

In an embodiment of the invention, a voltage-triggered dipole component having a controlled breakover sensitivity comprises a main thyristor having its gate connected to the anode through a pilot thyristor. A triggering transistor is disposed in parallel with the pilot thyristor, the base of the triggering transistor being connected to the gate of the pilot thyristor.

According to an embodiment of the invention, the emitter of the triggering transistor corresponds to the cathode region of the pilot thyristor, and the base of the triggering transistor corresponds to the gate region of the pilot thyristor.

In other words, the present invention provides a voltage-triggered dipole component including a vertical amplifying-gate thyristor further comprising a region having the type of conductivity of the substrate, replacing a portion of the anode layer of the pilot thyristor in front of a portion of the cathode region of this pilot thyristor.

Thus, an embodiment of the invention provides a voltage-triggered dipole component having a controlled breakover sensitivity comprising, in a semiconductor substrate, a first vertical NPNP structure corresponding to a main thyristor, a second vertical NPNP structure corresponding to a pilot thyristor, the anodes of the main thyristor and of the pilot thyristor corresponding to the same layer on the rear surface of the substrate. A portion of the anode layer of the pilot thyristor in front of a portion of the cathode region of this pilot thyristor is replaced with an additional layer having the conductivity type of the substrate, a rear surface metallization contacting the anode regions of the thyristors and the additional region, a cathode metallization being formed on the cathode of the main thyristor, and a connection metallization connecting the cathode of the pilot thyristor to the gate region of the main thyristor.

According to an embodiment of the invention, the component further comprises an extension of the gate region of the main thyristor facing a region of the same type of conductivity as the substrate to form a parallel, head-to-tail diode connected to the main thyristor.

The foregoing and other objects, features, aspects and advantages of the invention will become apparent from the following detailed description of the present invention when taken in conjunction with the accompanying drawings.

DETAILED DESCRIPTION

Figure 6:
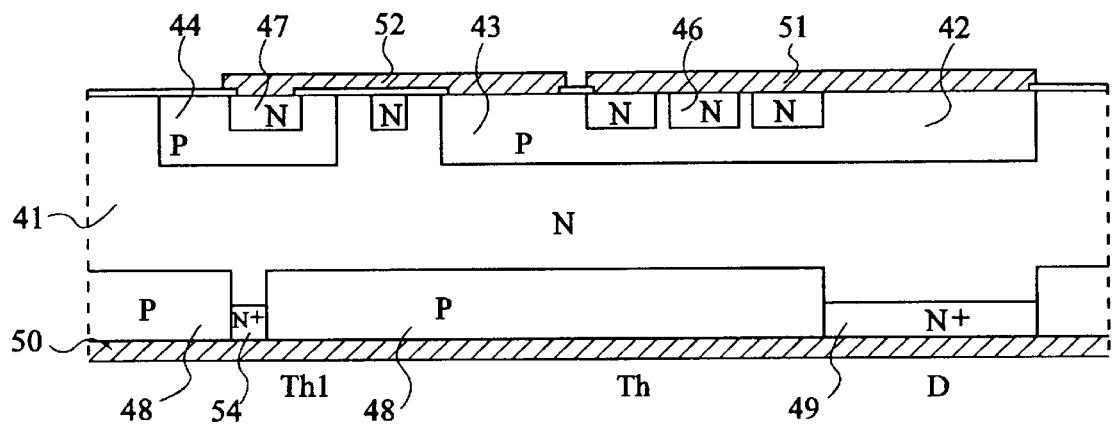
FIG. 6 is a schematic cross-sectional view of a component according to the present invention.

FIG. 6 is a cross-sectional view of a component according to the present invention. This component is similar to a conventional amplifying-gate thyristor with a parallel head-to-tail connected diode. This component is constituted from a low doped N-type substrate 41. In the upper surface, P-type regions 42, 43 and 44 correspond to the anode region of a diode D, to the gate region of a main thyristor Th, and to the gate region of a pilot thyristor 44, respectively. N-type regions 46 and 47 respectively corresponding to the cathode of the main thyristor and to the cathode of the auxiliary thyristor, are formed in regions 43 and 44, respectively. The rear surface of the substrate comprises a P-type region 48 facing thyristor regions, and an N-type region 49 facing the anode region of diode D. The rear surface is coated with a metallization 50. The cathode regions 46 of thyristor Th and anode region 42 of diode D are coated with a metallization 51. The cathode region 47 of the pilot thyristor Th1 is connected to the gate region 43 of the main thyristor Th through a metallization 52.

The above described component is similar to a conventional amplifying-gate thyristor comprising a main thyristor associated with a pilot thyristor.

One modification made by the present invention to this conventional structure includes a highly doped N-type region 54 facing a portion of the cathode region 47 of the pilot thyristor Th1. It should be noted that the formation of this region does not require any additional fabrication step with respect to the conventional fabrication of an amplifying-gate thyristor with a parallel head-to-tail connected diode since region 54 can be formed simultaneously with the cathode region 49 of the diode.

Figure 7:
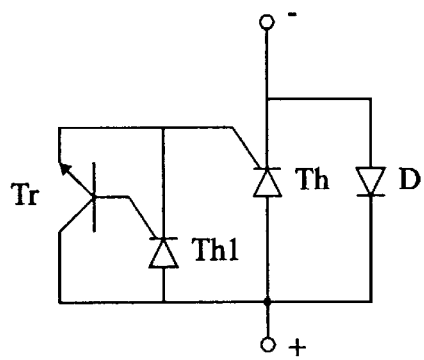
FIG. 7 is an equivalent diagram of the circuit of FIG. 6.

However, this structural modification, although it might appear slight, fundamentally modifies the system's operation. As represented in FIG. 7, the presence of region 54 is equivalent to connecting a transistor Tr in parallel with thyristor Th1. The emitter of transistor Tr corresponds to the cathode region 47 of the thyristor. The base of transistor Tr is formed by region 44 and corresponds to the gate region of thyristor Th1. The collector of transistor Tr corresponds to the N-substrate, and a contact with the collector is obtained through the $N_+$ region 54.

Figure 8:
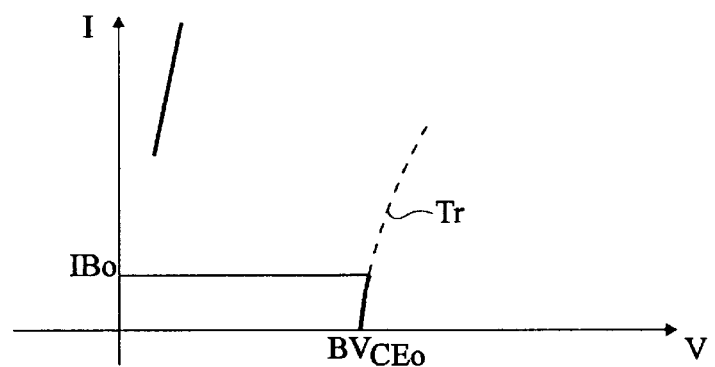
FIG. 8 represents a current-voltage curve illustrating the operation of the component of FIG. 6.

With a low current, as represented in FIG. 8, the characteristic curve of the whole structure is set by the transistor Tr. Transistor Tr is blocked as long as the voltage between its terminals is lower than $BV_{CEO}$ which, according to Miller's equation, is equal to $BV_{CBO}/\beta^{1/n}$, $BV_{CBO}$ being the breakdown voltage of the collector/base junction and $\beta$ being the transistor gain. For $\beta=10$ and $n=4$, if $BV_{CBO}$ is equal to 390 volts, then $BV_{CEO}=220$ volts. It is only when the current in transistor Tr has reached a value $I_{BO}$, that the thyristor Th breaks over only at that time. It should be noted that the determination of the breakover current of the thyristor mainly depends upon the size and shape of the $N^+$ region 54.

Accordingly, the breakover voltage of the device is mainly determined by the junction between regions 41 and 44, which corresponds to the collector-base junction of transistor Tr. The resistivity of the substrate material 41 is selected, for example, to be approximately 15Ω to 25Ω ($2.10^{14}$ to $3.10^{14}$ atoms/cm$^3$) so that the avalanche voltage of this junction is set to $BV_{CBO}$, for example, ranging approximately from 350 to 450 volts.

The presence of transistor Tr further makes it possible to render the pilot thyristor Th1 non-sensitive to dV/dt breakdowns.

Figure 1:
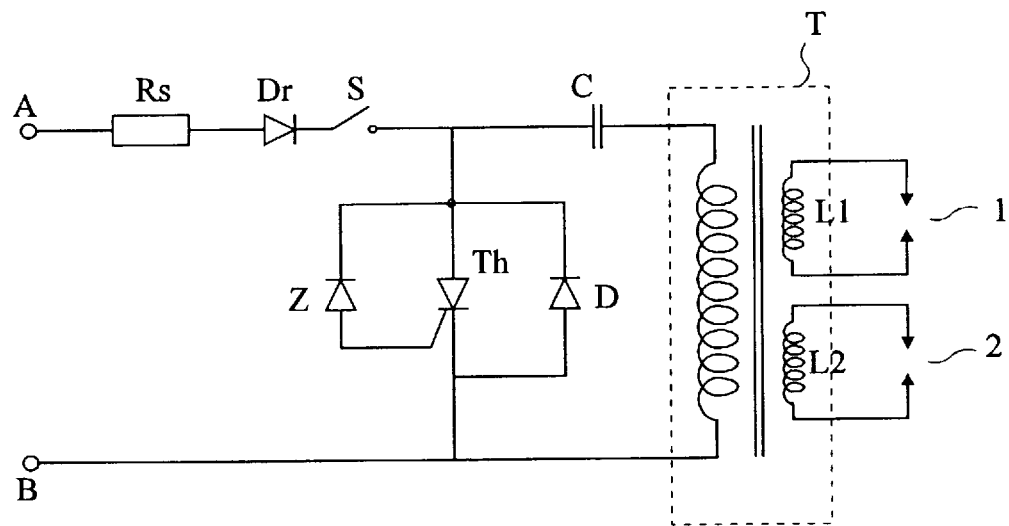
FIG. 1 illustrates a gas lighter circuit.
Figure 2:
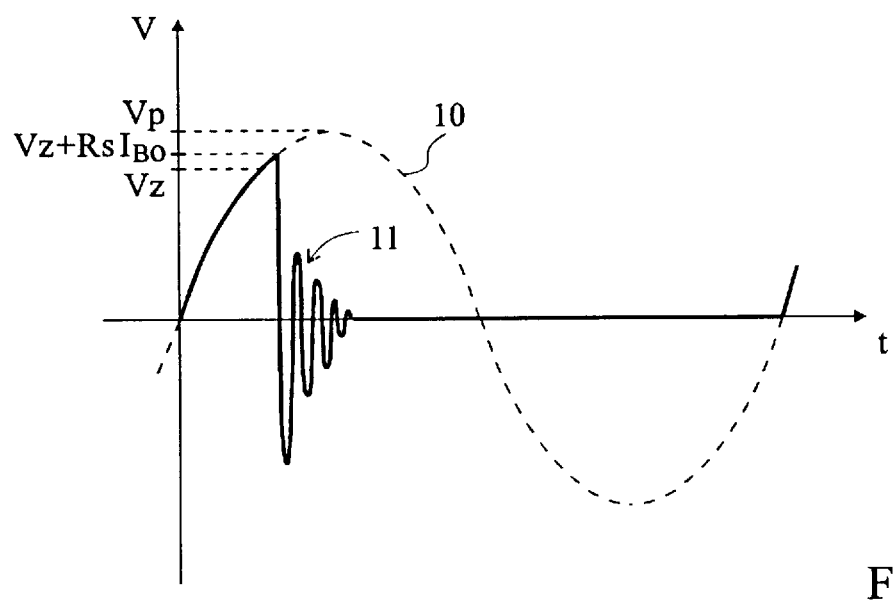
FIG. 2 is a curve of voltage V as a function of the time t illustrating the operation of the circuit of FIG. 1.
Figure 3:
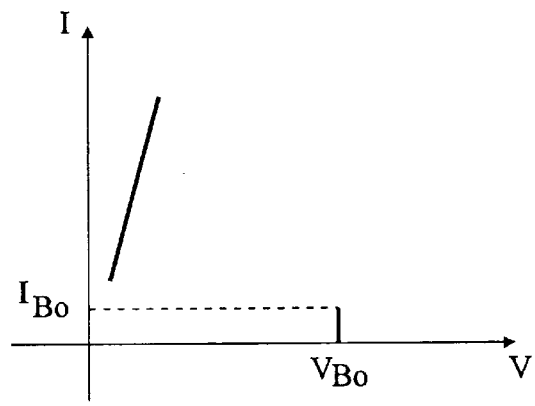
FIG. 3 is a voltage-breakover triggering characteristic curve of a thyristor.
Figure 4:
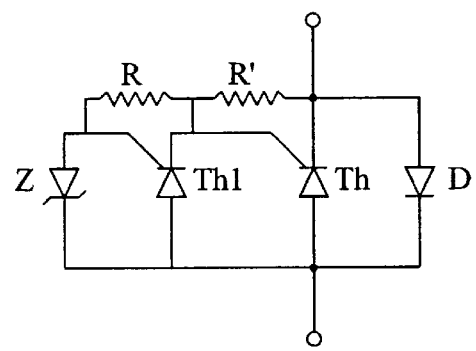
FIG. 4 illustrates a conventional circuit of a thyristor associated with a pilot thyristor and a triggering element.
Figure 5:
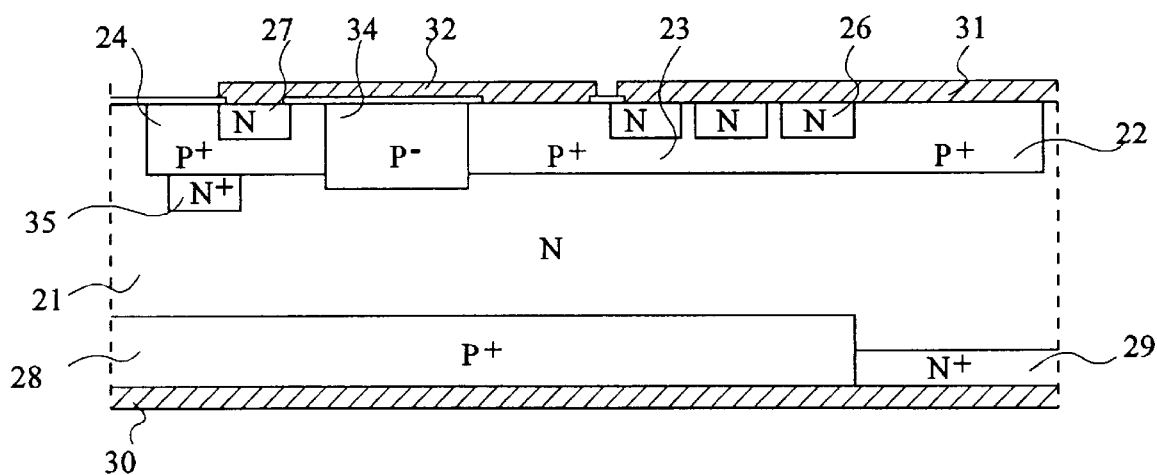
FIG. 5 is a schematic cross-sectional view of a component implementing the circuit of FIG. 4.

Some of the advantages of the present invention are:

the breakover current value $I_{BO}$ is simply adjusted by selecting the surface and the size of region 54;

the breakdown current is adjusted independently of the breakdown voltage by selecting the characteristics of the transistor (doping of the collector, doping of the base, thickness of the base); and the manufacturing process is much simpler than the conventional process since the steps for fabricating additional layers, such as layers 34 and 35 shown in FIG. 5, are avoided.

Of course, whereas the present invention has been disclosed only in connection with a gas-lighter circuit, the component according to the present invention can be used in any structure in which a voltage-triggered dipole component should have its breakover voltage and breakover current accurately determined, with the breakover current being low. In addition, although, in the described embodiment, the component is associated with a parallel, head-to-tail connected diode, such a diode need not be provided.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A dipole component triggered by a breakover voltage and having a controlled breakover sensitivity, comprising:

a main thyristor having a gate, a cathode, and an anode;

a pilot thyristor having a cathode connected to the gate of the main thyristor, an anode connected to the anode of the main thyristor, and a gate; and a triggering transistor having an emitter that is electrically coupled to the cathode of the pilot thyristor, a collector that is electrically coupled to the anode of the pilot thyristor, and a base that is connected to the gate of the pilot thyristor.

2. The component of claim 1 formed in a semiconductor substrate having a first region of a first conductivity type formed in a second region of a second conductivity type, wherein the first region of the first conductivity type forms both the emitter of the triggering transistor and the cathode of the pilot thyristor, and wherein the second region of the second conductivity type forms both the base of the triggering transistor and the gate of the pilot thyristor.

3. A dipole component triggered by a breakover voltage, comprising:

a vertical amplifying-gate thyristor formed in a semiconductor substrate of a first conductivity type, the vertical amplifying-gate thyristor having a main thyristor and a pilot thyristor, the main thyristor and the pilot thyristor each having an anode region formed in a common anode region on a lower surface of the semiconductor substrate, the common anode region being contacted by a common anode metallization;

wherein the semiconductor substrate includes an additional region of the first conductivity type that is not part of the vertical amplifying-gage thyristor, the additional region being disposed below a portion of a cathode region of the pilot thyristor, surrounded by the anode region of the pilot thyristor, and contacted by the common anode metallization.

4. A dipole component formed in a semiconductor substrate of a first conductivity type and triggered by a breakover voltage, the dipole component comprising:

a first vertical NPNP structure forming a main thyristor having a gate, a cathode and an anode;

a second vertical NPNP structure forming a pilot thyristor having a gate, a cathode and an anode, the anode of the main thyristor and the anode of the pilot thyristor corresponding to a same layer on a lower surface of the semiconductor substrate;

cathode metallization formed on the cathode of the main thyristor;

connection metallization connecting the cathode of the pilot thyristor to the gate of the main thyristor;

an additional region of the first conductivity type surrounded by the same layer, the additional region being disposed below a portion of the cathode of the pilot thyristor; and lower surface metallization formed on the lower surface of the semiconductor substrate and contacting the anodes of the main thyristor and the pilot thyristor and the additional region.

5. The component of claim 3, wherein the main thyristor has a gate region formed in the semiconductor substrate, and the semiconductor substrate further includes:

a second additional region of the first conductivity type formed on the lower surface of the semiconductor substrate; and an extension of the gate region of the main thyristor that extends above the second additional region to form a parallel diode that is head-to-tail connected to the main thyristor.

6. The component of claim 4, further comprising: a second additional region of the first conductivity type formed on the lower surface of the semiconductor substrate;

wherein the gate of the main thyristor extends above the second additional region to form a parallel diode that is head-to-tail connected to the main thyristor.

7. A dipole component, comprising:

a first terminal and a second terminal;

a main thyristor having a gate, a cathode, and an anode, the cathode of the main thyristor being coupled to the first terminal and the anode of the main thyristor being coupled to the second terminal;

a pilot thyristor having a gate, a cathode and an anode, the cathode of the pilot thyristor being coupled to the gate of the main thyristor, and the anode of the pilot thyristor being coupled to the anode of the main thyristor; and a triggering transistor having a first terminal that is coupled to the anode of the pilot thyristor, a second terminal that is coupled to the cathode of the pilot thyristor, and having a control terminal that is coupled to the gate of the pilot thyristor.

8. The dipole component of claim 7, wherein the triggering transistor has a base, an emitter and a collector, the base being coupled to the gate of the pilot thyristor, the emitter being coupled to the cathode of the pilot thyristor, and the collector being coupled to the anode of the pilot thyristor.

9. The dipole component of claim 8, further comprising:
a diode having an anode and a cathode, the anode of the diode being coupled to the cathode of the main thyristor and the cathode of the diode being coupled to the anode of main thyristor.

10. The dipole component of claim 8, wherein the main thyristor, the pilot thyristor and the triggering transistor are formed in a single substrate.

11. The dipole component of claim 8, wherein the main thyristor and the pilot thyristor are vertical NPNP structures formed in a single N type substrate.

12. The dipole component of claim 11, wherein the emitter of the triggering transistor and the cathode of the pilot thyristor are both formed in a first continuous region that is formed in the single N type substrate.

13. The dipole component of claim 12, wherein the base of the triggering transistor and the gate of the pilot thyristor are both formed in a second continuous region that is formed in the single N type substrate.

14. A dipole component formed in a semiconductor substrate, the semiconductor substrate having a first type of conductivity and upper and lower surfaces, the dipole component comprising:
first and second regions having a second type of conductivity formed in the upper surface of the semiconductor substrate, the second type of conductivity being opposite to the first type of conductivity, the first and second regions forming gate regions of a main thyristor and a pilot thyristor, respectively;
third and fourth regions formed respectively in the first and second regions, the third and fourth regions having the first type of conductivity and forming cathode regions of the main thyristor and the pilot thyristor, respectively;
first metallization formed on the upper surface of the semiconductor substrate in the third region that forms a first terminal of the dipole component;
second metallization formed on the upper surface of the semiconductor substrate in the fourth and first regions that connects the cathode region of the pilot thyristor to the gate region of the main thyristor;
a fifth region having the second type of conductivity formed in the lower surface of the semiconductor substrate below the third and fourth regions, the fifth region forming a common anode region that includes anode regions of the main thyristor and the pilot thyristor;
a sixth region having the first type of conductivity formed in the lower surface of the semiconductor substrate below a portion of the fourth region and surrounded by the fifth region; and
third metallization formed on the lower surface of the semiconductor substrate that connects the anode regions of the main thyristor and the pilot thyristor to the sixth region and forms a second terminal of the dipole component.

15. The dipole component of claim 14, wherein the second and fourth regions respectively form a base region and an emitter region of a transistor, and the semiconductor substrate forms a collector region of the transistor.

16. The dipole component of claim 15, further comprising a seventh region having the first type of conductivity formed in the lower surface of the semiconductor substrate below the first region and forming a cathode of a diode that is head-to-tail connected to the main thyristor.

17. The dipole component of claim 15, wherein the semiconductor substrate is a low doped N-type substrate and the sixth region is a highly doped N-type region.

18. The dipole component of claim 14, wherein the third region includes emitter shorts.

19. The dipole component of claim 14, wherein the dipole component has a breakover current and a breakover voltage, the breakover current being mainly determined by a shape and size of the sixth region, and the breakover voltage being mainly determined by a junction between the second region and the semiconductor substrate.

20. A method of forming a dipole component in a semiconductor substrate having a first type of conductivity, the method comprising the steps of:
forming first and second regions having a second type of conductivity in an upper surface of the semiconductor substrate, the second type of conductivity being opposite to the first type of conductivity, the first and second regions respectively providing gate regions of a main thyristor and a pilot thyristor of the dipole component;
forming third and fourth regions having the first type of conductivity in the first and second regions, the third and fourth regions providing cathode regions of the main thyristor and the pilot thyristor, respectively;
coating the upper surface of the semiconductor substrate in the third region with metallization to provide a first terminal of the dipole component;
coating the upper surface of the semiconductor substrate in the fourth and first regions with metallization to connect the cathode region of the pilot thyristor to the gate region of the main thyristor;
forming a fifth region having the second type of conductivity in a lower surface of the semiconductor substrate below the third and fourth regions, the fifth region providing a common anode region that includes anode regions of the main thyristor and the pilot thyristor;
forming a sixth region having the first type of conductivity in the lower surface of the semiconductor substrate below a portion of the fourth region, the sixth region being laterally surrounded by the fifth region; and
coating the lower surface of the semiconductor substrate with metallization to connect the anode regions of the main thyristor and the pilot thyristor to the sixth region to provide a second terminal of the dipole component.

21. The method of claim 20, wherein the step of forming the first and second regions includes a step of separating the first region from the second region with the semiconductor substrate.

22. The method of claim 20, further comprising a step of forming a seventh region having the first type of conductivity in the lower surface of the semiconductor substrate, the seventh region being disposed below at least a portion of the first region that does not include the fourth region to provide a cathode of a diode that is head-to-tail connected to the main thyristor.

23. The method of claim 22, wherein the steps of forming the sixth and seventh regions are performed simultaneously.

24. The method of claim 23, wherein the semiconductor substrate is a low doped N-type substrate and the steps of forming the sixth and seventh regions includes forming highly doped N-type regions.

25. The method of claim 20, wherein the step of forming the first and second regions includes a step of providing emitter shorts in the first region.

26. The method of claim 20, wherein the step of forming the sixth region includes a step of adjusting a shape and size of the sixth region to adjust a breakover current of the dipole component.

* * * * *